(12) United States Patent
Boss et al.

(10) Patent No.: US 6,529,012 B1
(45) Date of Patent: Mar. 4, 2003

(54) ARRANGEMENT FOR DETERMINING THE COMPLEX TRANSMISSION FUNCTION OF A MEASURING DEVICE

(75) Inventors: Hermann Boss, Holzkirchen (DE); Alexander Roth, Dorfen (DE); Manfred Müller, Mühldorf (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/831,270
(22) PCT Filed: Aug. 24, 2000
(86) PCT No.: PCT/EP00/08286
§ 371 (c)(1), (2), (4) Date: May 16, 2001
(87) PCT Pub. No.: WO01/25811
PCT Pub. Date: Apr. 12, 2001

(30) Foreign Application Priority Data

Oct. 7, 1999 (DE) .......................... 199 48 384

(51) Int. Cl.$^7$ .................................. G01R 27/28
(52) U.S. Cl. ...................................... 324/615
(58) Field of Search ............... 324/76.19, 615, 324/618

(56) References Cited

U.S. PATENT DOCUMENTS

| | | | |
|---|---|---|---|
| 3,777,271 A | | 12/1973 | Telewski |
| 3,813,599 A | | 5/1974 | Campbell |
| 4,822,991 A | * | 4/1989 | Riggs et al. .............. 250/211 J |
| 5,157,361 A | * | 10/1992 | Gruchalla et al. ............ 333/20 |
| 5,422,594 A | * | 6/1995 | Liao et al. .................. 327/120 |
| 5,594,458 A | | 1/1997 | Garn et al. |
| 5,847,569 A | * | 12/1998 | Ho et al. ..................... 324/752 |
| 6,232,760 B1 | * | 5/2001 | Eckert ...................... 324/76.19 |

FOREIGN PATENT DOCUMENTS

| | | |
|---|---|---|
| DE | 19654740 | 5/1999 |
| DE | 19757296 | 7/1999 |

OTHER PUBLICATIONS

Bartz et al., Hewlett Packard Journal, pp. 31–46 (1993).

Cutler et al., Hewlett Packard Journal, pp. 47–59 (1993).

* cited by examiner

*Primary Examiner*—Christine Oda
*Assistant Examiner*—Etienne P LeRoux
(74) *Attorney, Agent, or Firm*—Birch, Stewart, Kolasch & Birch, LLP

(57) ABSTRACT

With a view to determining the complex transfer function of a measuring instrument, a line spectrum is fed in from a pulse generator which, for example, is constituted by a step-recovery diode, and the digitized output signal arising at the output of the measuring instrument is evaluated in a computer.

4 Claims, 1 Drawing Sheet

Figure 1:
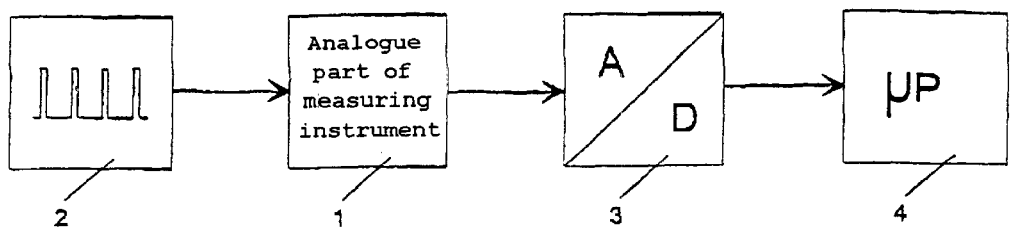

ARRANGEMENT FOR DETERMINING THE COMPLEX TRANSMISSION FUNCTION OF A MEASURING DEVICE

This application is the national phase under 35 U.S.C. §371 of PCT International Application No. PCT/EP99/08286 which has an International filing date of Aug. 24, 2000, which designated the United States of America.

The invention relates to an arrangement according to the preamble of claim 1.

Arrangements of this type are known (Hewlett Packard Journal, December 1993, p 31 ff and p 47 ff, prior German Patent Application 197 57 296.0). With such an arrangement the transfer function of a measuring instrument, for example a spectrum analyser, from the input socket as far as the A/D converter, that is to say in respect of the entire analogue part of the measuring instrument, can be determined. As a result of evaluation by magnitude and phase of the measured values obtained in this way in the computer, the inverse function of the measured transfer function can be calculated and hence the transfer function of the measuring instrument can be compensated during the operation thereof. This process can be utilized both for narrowband and for very broadband analogue parts of measuring instruments. It is therefore also highly suitable for the calibration of intermediate-frequency stages (IF part) of measuring instruments that can no longer be adequately corrected in the baseband.

The calibrating and compensating process that can be performed with such an arrangement presupposes a signal at the A/D converter that, considered within the frequency range, represents the amplitude response and the group delay or phase within the bandwidth to be corrected. In general, this is obtained with a line spectrum that, for example, exhibits equidistant lines within the range of measurement. The spacing of the lines is chosen to be so small that the amplitude response and the phase response are modelled with sufficient precision by the lines.

In the arrangements of this type known hitherto the line spectrum is generated either by digital methods using a D/A converter (Hewlett Packard Journal, December 1993) or with the aid of a calibrating signal that increases in frequency over time and that is generated by multiplication of a monofrequency carrier signal by an auxiliary signal that increases in frequency in linear manner (Patent Application 197 57 296.0). These known devices for generating a line spectrum are relatively elaborate in terms of circuit technology; in addition, they have the disadvantage that, in the case of high bandwidth, the lines of the spectrum are generated in temporal succession and therefore a relatively long measuring-time is necessary.

The object of the invention is to create an arrangement of this type that enables the generation of a line spectrum with relatively little effort in terms of circuit technology.

This object is achieved, starting from an arrangement according to the preamble of claim 1, by virtue of the characterizing features of said claim.

According to the invention, a pulse generator or comb generator known as such, such as is present and used, for example, as a source of pulse signals in many measuring instruments and such as is described, for example, in the book entitled "Grundlagen der Mikrowellentechnik" by M. Kummer, VEB-Verlag Technik, 1986, p 329, is used for the purpose of generating the line spectrum. Such a pulse generator can be implemented, up to high frequencies in the GHz range, by means of a step-recovery diode, for example; very broadband pulse spectra can be generated which, up into the GHz range, still exhibit sufficient amplitude properties and phase properties. With such a pulse generator it is accordingly possible for the calibrating signal that is required for such a measuring arrangement to be generated very simply, precisely and reproducibly. Hence arbitrary broadband measuring instruments can also be calibrated precisely, and the transfer function thereof can be corrected in terms of magnitude and phase or group delay. Since, in the case of the pulse generator according to the invention, all the lines of the line spectrum are always present simultaneously, a very rapid calibration is also possible; the speed depends only on the necessary sampling-rate of the evaluating A/D converter for the purpose of capturing the spectrum and on the necessary number of sampled values for a sufficiently precise calculation of the compensation function of the transfer function.

The invention is elucidated in the following on the basis of schematic drawings in respect of an embodiment example.

FIG. 1 shows the schematic structure of an arrangement for determining the transfer function of a measuring instrument 1, for example a spectrum analyser. At the input of the measuring instrument 1 a line spectrum is fed in from a pulse generator 2, the bandwidth of said line spectrum corresponding to at least the bandwidth of the measuring instrument. At the output of the measuring instrument 1, the transfer function of which is to be measured and compensated, the output signal is sampled in an A/D converter 3; the digitized values are evaluated in a digital computer 4.

Figure 2:
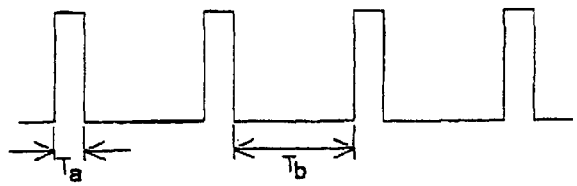
Figure 3:
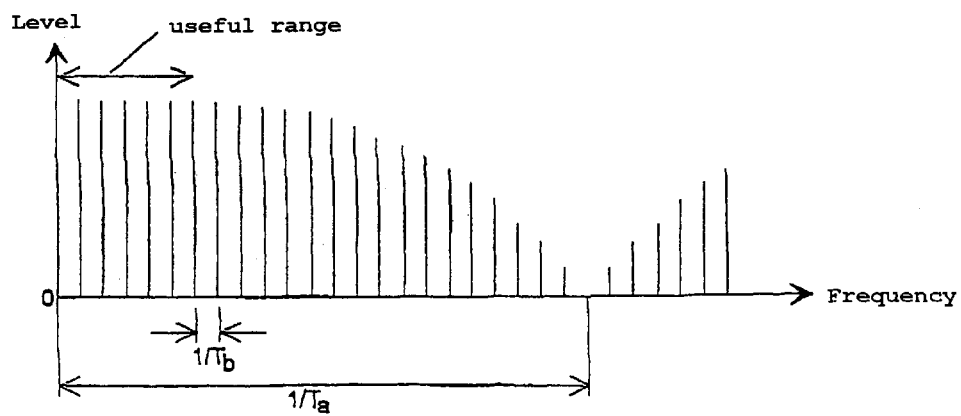

A pulse signal in the time-domain representation according to FIG. 2 is generated in the pulse generator; in the ideal case the pulses are so-called Dirac impulses, the duration $T_a$ of which approaches zero. The spacing of the spectral lines is determined by means of the pulse width $T_a$, and the shape of the spectrum is determined by means of the pulse spacing $T_b$, as shown by the frequency-domain representation according to FIG. 3. In the case of an ideal pulse signal consisting of Dirac impulses, the pulse spectrum is infinitely wide, $1/T_a$ approaches ∞. For pulses of finite width, the envelope curve of the line spectrum is a $\sin(x)/x$ function; the useful range of the spectrum follows from the requirement as to how precise the conformity of the line-lengths, i.e. the slope of the $\sin(x)/x$ curve, has to be.

What is claimed is:

1. A system for determining a complex transfer function of a measuring instrument comprising:
   a pulse generator for generating a line spectrum;
   a measuring instrument for receiving said line spectrum;
   an analog/digital converter for sampling an output of said measuring instrument; and
   a computer for receiving digital signals from said analog/digital converter and evaluating the output of the measuring instrument to determine the complex transfer function.

2. The system according to claim 1, wherein the pulse generator is a step-recovery diode.

3. The system according to claim 1, wherein the line spectrum includes lines having a pulse width $T_a$ and spacing between pulses of $T_b$.

4. The system according to claim 1, wherein an envelope curve of the line spectrum is a $\sin(x)/x$ function.

* * * * *